US009854670B2

United States Patent
Uchida et al.

(10) Patent No.: US 9,854,670 B2
(45) Date of Patent: Dec. 26, 2017

(54) TRANSPARENT ELECTRODE AND METHOD FOR PRODUCING SAME

(71) Applicant: SHOWA DENKO K.K., Tokyo (JP)

(72) Inventors: Hiroshi Uchida, Tokyo (JP); Yasunao Miyamura, Tokyo (JP); Eri Okazaki, Tokyo (JP); Hideki Ohata, Tokyo (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

(21) Appl. No.: 14/913,161

(22) PCT Filed: Aug. 14, 2014

(86) PCT No.: PCT/JP2014/071427
§ 371 (c)(1),
(2) Date: Feb. 19, 2016

(87) PCT Pub. No.: WO2015/025792
PCT Pub. Date: Feb. 26, 2015

(65) Prior Publication Data
US 2016/0205775 A1 Jul. 14, 2016

(30) Foreign Application Priority Data
Aug. 22, 2013 (JP) ................................. 2013-172238

(51) Int. Cl.
*H05K 1/09* (2006.01)
*H05K 3/12* (2006.01)
(Continued)

(52) U.S. Cl.
CPC ......... *H05K 1/0373* (2013.01); *C09D 11/106* (2013.01); *C09D 11/52* (2013.01);
(Continued)

(58) Field of Classification Search
CPC ...... H05K 1/0373; H05K 1/09; H05K 3/1283; H01B 1/22
See application file for complete search history.

(56) References Cited

U.S. PATENT DOCUMENTS

| 2007/0074316 A1 | 3/2007 | Alden et al. | |
| 2008/0206488 A1* | 8/2008 | Chung | ..................... C09D 5/24 |
| | | | 427/596 |

(Continued)

FOREIGN PATENT DOCUMENTS

| CN | 101589473 A | 11/2009 |
| CN | 102087884 A | 6/2011 |

(Continued)

OTHER PUBLICATIONS

Shih-Hsiang Lai, et al. "P-9: Metallic Nanowires Film as Transparent Conducting Layer in TFT-LCDs", SID Symposium Digest of Technical Papers, 2008, pp. 1200-1202, vol. 39, issue 1.

(Continued)

*Primary Examiner* — Hoa C Nguyen
(74) *Attorney, Agent, or Firm* — Sughrue Mion, PLLC

(57) ABSTRACT

Provided are a transparent electrode and a production method thereof, the transparent electrode using metal nanowires and/or metal nanotubes as conductive components, and showing favorable surface flatness, conductivity, and light transmittance. A transparent conductive ink is prepared by dispersing metal nanowires and/or metal nanotubes in a solution formed by dissolving a thermoset or thermoplastic binder resin having no fluidity within the range of 5 to 40° C. to a solvent, the content of the binder resin being 100 to 2500 parts by mass relative to 100 parts by mass of the metal nanowires and/or metal nanotubes. An electrode pattern having a desired shape is printed on a substrate with the transparent conductive ink, and pulsed light is irradiated to the printed electrode pattern, to thereby (Continued)

obtain a transparent electrode having a surface resistance of 0.1 to 500Ω/☐ and a surface arithmetic average roughness Ra satisfying Ra≤5 nm.

13 Claims, 1 Drawing Sheet

(51) Int. Cl.
*H05K 1/03* (2006.01)
*H01B 1/22* (2006.01)
*C09D 11/106* (2014.01)
*C09D 11/52* (2014.01)
*H05K 3/10* (2006.01)

(52) U.S. Cl.
CPC ............... *H01B 1/22* (2013.01); *H05K 1/09* (2013.01); *H05K 1/097* (2013.01); *H05K 3/1283* (2013.01); *H05K 1/0306* (2013.01); *H05K 3/106* (2013.01); *H05K 2201/0108* (2013.01); *H05K 2201/026* (2013.01)

(56) References Cited

U.S. PATENT DOCUMENTS

| | | | |
|---|---|---|---|
| 2011/0070404 A1* | 3/2011 | Naoi | G03C 1/853 428/156 |
| 2011/0088770 A1* | 4/2011 | Allemand | B82Y 10/00 136/256 |
| 2012/0027994 A1 | 2/2012 | Takada et al. | |
| 2012/0031460 A1* | 2/2012 | Hosoya | H01B 1/22 136/244 |
| 2012/0161113 A1* | 6/2012 | Lowenthal | H01L 25/048 257/40 |
| 2012/0164796 A1* | 6/2012 | Lowenthal | H01L 25/048 438/127 |
| 2012/0321864 A1* | 12/2012 | Lowenthal | C09D 11/52 428/195.1 |
| 2013/0014980 A1* | 1/2013 | Takeda | H01L 51/5212 174/257 |
| 2013/0122279 A1* | 5/2013 | Tsujimoto | H01B 1/20 428/315.7 |
| 2013/0126799 A1* | 5/2013 | Naoi | H01B 1/22 252/514 |
| 2013/0149435 A1 | 6/2013 | Kirchmeyer et al. | |
| 2015/0030783 A1 | 1/2015 | Suganuma et al. | |
| 2015/0072259 A1* | 3/2015 | Furukoshi | H01M 8/04029 429/436 |
| 2015/0103269 A1* | 4/2015 | Suganuma | G06F 3/044 349/12 |
| 2015/0364713 A1* | 12/2015 | Takeda | H01L 51/445 257/40 |

FOREIGN PATENT DOCUMENTS

| | | |
|---|---|---|
| CN | 103068573 A | 4/2013 |
| CN | 103106950 A | 5/2013 |
| JP | 2003-100147 A | 4/2003 |
| JP | 4077675 A | 4/2008 |
| JP | 2009-505358 A | 2/2009 |
| JP | 2009-129607 A | 6/2009 |
| JP | 2010-205532 A | 9/2010 |
| JP | 2011-198642 A | 10/2011 |
| JP | 2012-216535 A | 11/2012 |
| WO | 2008046058 A2 | 4/2008 |
| WO | 2010/106899 A1 | 9/2010 |
| WO | 2013/133420 A1 | 9/2013 |

OTHER PUBLICATIONS

International Search Report for PCT/JP2014/071427 dated Oct. 28, 2014 [PCT/ISA/210].
Written Opinion for PCT/JP2014/071427 dated Oct. 28, 2014 [PCT/ISA/237].
First Office Action dated Sep. 26, 2016, from the State Intellectual Property Office of People's Republic of China in counterpart Application No. 201480046100.6.

* cited by examiner

FIG. 1
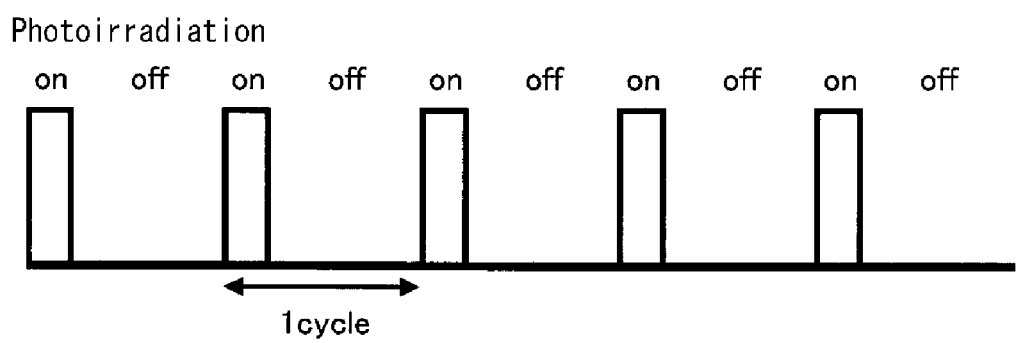
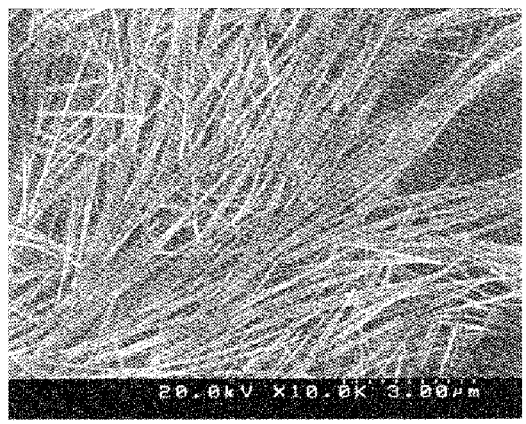
FIG. 2(a)
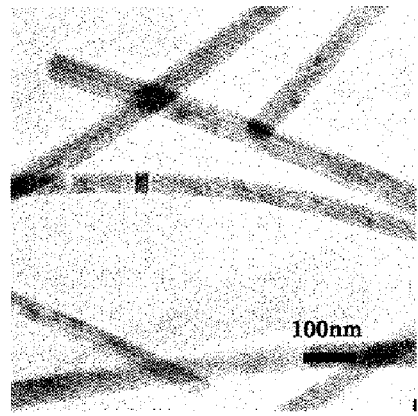
FIG. 2(b)

TRANSPARENT ELECTRODE AND METHOD FOR PRODUCING SAME

CROSS REFERENCE TO RELATED APPLICATIONS

This application is a National Stage of International Application No. PCT/JP2014/071427 filed Aug. 14, 2014, claiming priority based on Japanese Patent Application No. 2013-172238 filed Aug. 22, 2013, the contents of all of which are incorporated herein by reference in their entirety.

TECHNICAL FIELD

The present disclosure relates to a transparent electrode and a method for producing the same.

BACKGROUND ART

A transparent electrode has become an indispensable component for a display device such as an organic EL (electroluminescence) display, a liquid crystal display, etc., a touch panel used for a tablet-type portable terminal such as a smartphone, and used for other various input devices, etc., a solar cell, and the like.

Conventionally, ITO (Indium Tin Oxide) has been used for transparent conductive films used for such transparent electrodes. However, indium used for ITO is a rare metal, and recently, stabilizing the supply and the price of indium has become an issue. Also, for the formation of ITO films, a sputtering method, a vapor-deposition method, and the like are used, and thus, a vacuum production apparatus is required and the production takes a long time, resulting in the higher cost. Further, a crack may be easily generated in ITO due to a physical stress such as bending and ITO can be easily broken. Therefore, applying ITO to a flexible substrate is difficult. Accordingly, alternative materials of ITO capable of overcoming these drawbacks have been searched for.

Among "alternative materials of ITO", as materials which do not require the use of a vacuum production apparatus, and which can be used for forming films by coating, conductive materials, for example, (i) polymer-based conductive materials such as poly(3,4-ethylenedioxythiophene)/poly(4-styrenesulfonic acid) (PEDOT: PSS) (for example, refer to Patent Document 1), conductive materials containing a nanostructured conductive component such as (ii) metal nanowires (for example, refer to Patent Document 2 and Non-patent Document 1), and (iii) carbon nanotubes (for example, refer to Patent Document 3), have been reported.

Among these, (ii) conductive materials containing metal nanowires are reported to have a low surface resistance and a high light transmittance (for example, refer to Patent Document 2 and Non-patent Document 1), and further, have flexibility, and thus, are suitable as "alternative materials of ITO".

Here, for example, in case of an organic EL element, an ultrathin film of an organic compound is formed on an electrode. Thus, when a transparent electrode having a low surface smoothness is used, functions of the organic EL element are decreased. Therefore, a superior surface smoothness is required for a transparent electrode.

When a transparent electrode is formed using the above-mentioned conductive material containing metal nanowires, in order to increase the surface flatness of the transparent electrode, there is a proposed method of forming a conductive layer with metal nanowires on a support having high flatness, and of transferring the formed conductive layer to another support (Patent Document 4). However, adjusting the balance between the adhesiveness and releasability of the adhesive agent used for transfer with the support and the conductive layer is difficult, and thus, perfect transfer is difficult. Further, this method has a large number of steps including coating an adhesive layer, curing, laminating support films, and releasing, which leads to the increase in cost.

Patent Document 5 discloses a method for producing a transparent electrode by a step of forming a first conductive layer by coating a liquid containing metal nanowires and a binder, a step of cross-linking or curing the binder, a step of forming a second conductive layer by coating an aqueous dispersion containing a conductive polymer and a non-conductive polymer on the first conductive layer, and a step of pattern printing nanowire removing liquid and washing with water. In this method, in order to ensure the surface flatness, two layers are formed, which leads to the increase of the production steps, and the disadvantage in regards to productivity.

PRIOR ARTS

Patent Document

Patent Document 1: Japanese Patent No. 4077675
Patent Document 2: Japanese Unexamined Patent Publication (Kohyo) No. 2009-505358
Patent Document 3: Japanese Unexamined Patent Publication (Kokai) No. 2003-100147
Patent Document 4: WO 2010/106899
Patent Document 5: Japanese Unexamined Patent Publication (Kokai) 2010-205532

Non-Patent Document

Non-Patent Document 1: Shih-Hsiang Lai, Chun-Yao Ou, Chia-Hao Tsai, Bor-Chuan Chuang, Ming-Ying Ma, and Shuo-Wei Liang; SID Symposium Digest of Technical Papers, Vol. 39, Issue 1, pp. 1200-1202 (2008)

SUMMARY

One of the objectives of the present disclosure is to provide a transparent electrode having superior surface flatness, conductivity, and light transmittance, and showing high productivity, using metal nanowires and/or metal nanotubes as conductive components, and a method for producing the same.

In order to attain the above objective, an embodiment of the present disclosure is a transparent electrode comprising metal nanowires and/or metal nanotubes, and a thermoset or thermoplastic binder resin having no fluidity in the range of 5 to 40° C., a surface resistance of 0.1 to 500Ω/□, and an arithmetic average roughness Ra of the surface satisfying Ra≤5 nm, and comprising a single conductive layer.

The arithmetic average roughness Ra of surface preferably satisfies Ra≤4 nm.

The transparent electrode preferably has a metal nanowire and/or metal nanotube content of 4 to 50% by mass.

The metal of the metal nanowire and/or metal nanotube preferably comprises silver.

The binder resin is preferably at least one selected from a group consisting of poly-N-vinylpyrrolidone, poly-N-vinylcaprolactam, poly-N-vinylacetamide, and poly-N-vinylformamide.

Another embodiment of the present disclosure is a method for producing a transparent electrode comprising: a step of printing an electrode pattern having a desired shape on a substrate with a transparent conductive ink, the ink containing metal nanowires and/or metal nanotubes dispersed in a solution in which a thermoset or thermoplastic binder resin having no fluidity within the range of 5 to 40° C. is dissolved in a solvent, the content of the binder resin being 100 to 2500 parts by mass relative to 100 parts by mass of the metal nanowires and/or metal nanotubes; and a step of irradiating pulsed light to the printed electrode pattern.

Further, another embodiment of the present disclosure is a transparent conductive ink for forming a transparent electrode comprising metal nanowires and/or metal nanotubes, a solvent, and a thermoset or thermoplastic insulating binder resin dissolved in the solvent and having no fluidity within the range of 5 to 40° C., the content of the binder resin being 100 to 2500 parts by mass relative to 100 parts by mass of the metal nanowires and/or metal nanotubes.

According to the present disclosure, metal nanowires and/or metal nanotubes are used as conductive components, and thereby, a transparent electrode having a superior surface flatness, conductive, and light transmittance can be produced at a high productivity.

BRIEF DESCRIPTION OF DRAWINGS

FIG. 1 is a view illustrating the definition of pulsed light.

FIGS. 2(a) and 2(b) show SEM images of silver nanowires produced according to the example.

EMBODIMENT

Hereinbelow, an exemplary embodiment of the present disclosure (hereinafter, referred to as an embodiment) will be described, with reference to the drawings.

A transparent electrode according to the present embodiment is formed by printing an electrode pattern having a desired shape on a substrate with a transparent conductive ink, the ink comprising metal nanowires and/or metal nanotubes dispersed in a solution (dispersion medium) in which a thermoset or thermoplastic binder resin having no fluidity within the range of to 40° C. is contained, and irradiating pulsed light to the printed pattern to provide conductivity thereto. Here, the temperature of 5 to 40° C. refers to a room temperature at which printing is normally performed.

The thermoset or thermoplastic binder resin having no fluidity within the range of 5 to 40° C. may be any transparent resin as far as the resin itself has no fluidity at the room temperature and can be dissolved in the solvent. The resin having high heat resistance and low hygroscopicity is more preferable. Here, the thermoset resin refers to a resin which can be dissolved in the solvent when the resin is in the uncured state. The thermoset resin is preferably cured by heat by photoirradiation mentioned below. Such a binder resin may be, for example, an acrylic resin, an epoxy resin, an epoxy acrylate resin, an urethane acrylate resin, an unsaturated polyester resin, an allylester resin, a diallyl phthalate (DAP) resin, an urethane resin, a silicone resin, a polyester resin, a polycarbonate resin, a polyamide resin (nylon), an amorphous polyolefin resin, polystyrene, polyvinyl acetate, poly-N-vinylamide, poly-4-methylpentene-1, and the like. Among them, poly-N-vinylamide such as poly-N-vinylpyrrolidone, poly-N-vinylcaprolactam, poly-N-vinylacetamide, poly-N-vinylformamide, etc., having superior affinity for silver, and an insulating resin having a superior transparency, such as cyclo olefin polymer (COP), cyclo olefin copolymer (COC), an epoxy resin, an urethane acrylate resin, an urethane resin, etc., may be used. Other known conductive resin may also be used, in accordance with needs.

In particular, poly-N-vinylamides such as poly-N-vinylpyrrolidone, poly-N-vinylcaprolactam, poly-N-vinylacetamide, poly-N-vinylformamide, etc., are preferable, because these can be used at the time of synthesizing nanowires, and also can be added after the synthesis of nanowires as a material for forming a protective film and for preventing aggregation, and the excessive use of poly-N-vinylamides from the production step of nanowires may make the production easier and increase the quality of the resulting electrodes.

The metal nanowire and the metal nanotube are metal having a diameter of the wire in the order of nanometer. The metal nanowire is a conductive material having a wire shape, and the metal nanotube is a conductive material having porous or nonporous tubular shape. In the present specification, both the "wire" shape and the "tubular" shape refer to a linear shape, and the former is not hollow, whereas the latter is hollow. They may be soft or rigid. Either metal nanowires or metal nanotubes may be used, but they may be mixed.

The kind of the metal may be one selected from the group consisting of gold, silver, platinum, copper, nickel, iron, cobalt, zinc, ruthenium, rhodium, palladium, cadmium, osmium, and iridium, or may be an alloy etc., formed by combining some of these. In order to obtain a coating film having a low surface resistance and a high total light transmittance, containing at least one of gold, silver, and copper is preferable. These metals have a high conductivity, and thus, when a certain surface resistance should be obtained, the density of the metal within the surface may be reduced, and high total light transmittance can be achieved.

Among these metals, containing at least gold or silver is preferable. The most appropriate example may be the silver nanowire.

The metal nanowires and/or the metal nanotubes in the transparent conductive ink preferably show certain distributions regarding their diameter sizes, major axis lengths, and aspect ratios. The distributions are selected so that the coating film obtained by the transparent conductive ink according to the present embodiment has a high total light transmittance and a low surface resistance. Specifically, the metal nanowires and the metal nanotubes have an average diameter size of preferably 1 to 500 nm, more preferably 5 to 200 nm, still more preferably 5 to 100 nm, and particularly preferably 10 to 70 nm. The metal nanowires and/or the metal nanotubes have an average major axis length of preferably 1 to 100 μm, more preferably 1 to 80 μm, still more preferably 5 to 80 μm, and particularly preferably 10 to 50 μm. While satisfying the above average diameter size and the average major axis length, the metal nanowires and/or the metal nanotube have an average aspect ratio of preferably more than 5, more preferably 10 or more, still more preferably 100 or more, and particularly preferably 200 or more. Here, the aspect ratio refers to a value obtained by a/b, wherein "b" represents an average diameter size of the metal nanowire and/or the metal nanotube and "a" represents an average major axis length thereof. The values "a" and "b" may be measured by a scanning electron microscope (SEM).

The production method for the metal nanowire and/or the metal nanotube may be a known production method. For example, silver nanowires may be synthesized by reducing silver nitrate in the presence of polyvinylpyrrolidone, using the Poly-ol method (refer to Chem. Mater., 2002, 14, 4736). Similarly, gold nanowires may be synthesized by reducing gold chloride acid hydrate in the presence of polyvinylpyrrolidone (refer to J. Am. Chem. Soc., 2007, 129, 1733). WO 2008/073143 pamphlet and WO 2008/046058 pamphlet have detailed description regarding the technology of large scale synthesis and purification of silver nanowires and gold nanowires. Gold nanotubes having a porous structure may be synthesized by using silver nanowires as templates, and reducing gold chloride acid solution. The silver nanowires used as templates are dissolved in the solution by oxidation-reduction reaction with the gold chloride acid, and as a result, gold nanotubes having a porous structure can be produced (refer to J. Am. Chem. Soc., 2004, 126, 3892-3901).

A transparent conductive ink for forming a transparent electrode according to the present disclosure may be prepared by dissolving the above-mentioned thermoset or thermoplastic binder resin having no fluidity within the range of 5 to 40° C. (room temperature) in a solvent, and dispersing metal nanowires and/or metal nanotubes therein. Here, the solvent to be used is not limited and may be any solvent which can be normally used for gravure printing, screen printing, gravure offset printing, flexo printing, and the like. In case of gravure printing, a solvent having a comparatively low boiling point is used. In case of screen printing, a solvent having a comparatively high boiling point is used.

The solvent having a comparatively low boiling point, which can be used for gravure printing, has a boiling point of 50° C. or more and 200° C. or less, and preferably 150° C. or less. Organic solvents, for example, aromatic hydrocarbon solvents such as toluene, xylene, etc., ketone-based solvents such as acetone, methyl ethyl ketone, etc., ester-based solvents such as ethyl acetate, n-propyl acetate, etc., alcohol-based solvents such as isopropanol, n-propanol, 2-butanol, isobutyl alcohol, n-butyl alcohol, etc., may be used.

The solvent having a comparatively high boiling point, which can be used for screen printing, has a boiling point of 120° C. or more and 360° C. or less, and preferably 150° C. or more. Specifically, the solvent may be butyl carbitol acetate, butyl carbitol, terpineol, isobornyl cyclohexanol (Product Name: Tersorb MTPH, manufactured by Nippon Terpene Chemicals, Inc.), xylene, bis ethoxy ethane, ethylene glycol, propylene glycol, and the like.

One of these solvents, or a combination of two or more solvents may be used.

With respect to the transparent conductive ink according to the present embodiment, the content of the metal nanowires and/or the metal nanotubes relative to the total mass of the transparent conductive ink is 0.01 to 10% by mass, and more preferably 0.05 to 2% by mass, from the viewpoints of preferable dispersion property of the nanowires and/or nanotubes, preferable pattern forming property of the coating film obtained by the transparent conductive ink, high conductivity, and a preferable optical property. If the metal nanowires and/or the metal nanotubes are contained less than 0.01% by mass, a very thick transparent conductive film layer should be printed in order to ensure a desired conductivity, and thus, the degree of difficulty in printing increases, and maintaining the pattern during drying becomes difficult. If the content of nanowires/nanotubes exceeds 10% by mass, the printing must be performed very thin in order to ensure a desired transparency, and the printing is also difficult.

An appropriate amount of a thermoset or thermoplastic binder resin having no fluidity at a room temperature, which is to added to the metal nanowires and/or metal nanotubes, may be different depending on the kind of resin to be used, but, in general, the amount of the resin is preferably 100 parts by mass to 2500 parts by mass, and more preferably 150 parts by mass to 2000 parts by mass, relative to 100 parts by mass of the metal nanowires and/or metal nanotubes. If the content of the binder resin is 100 parts by mass or less, the surface flatness tends to decrease. If the content of the binder resin exceeds 2500 parts by mass, decreasing the surface resistance becomes difficult even if the pulsed light irradiation is performed.

As far as the properties are not damages, the transparent conductive ink according to the present embodiment may contain any selected components other than the above components (metal nanowires, metal nanotubes, and a binder resin), which may be a wet dispersing agent for improving wettability to the substrate, a surface conditioner, an antifoaming agent, a thixotropic agent, a leveling agent, a corrosion inhibitor, an adhesive accelerator, a surfactant, etc.

The wet dispersing agent may be DISPERBYK (registered trademark)-106, DISPERBYK (registered trademark)-108 (manufactured by BYK Japan K. K.), etc. The surface conditioner may be BYK (registered trademark)-300, BYK (registered trademark)-306 (manufactured by BYK Japan K. K.), etc. The antifoaming agent may be BYK (registered trademark)-051, BYK (registered trademark)-054 (manufactured by BYK Japan K. K.), etc. The thixotropic agent may be BYK (registered trademark)-405, BYK (registered trademark)-410 (manufactured by BYK Japan K. K.), etc. The leveling agent may be BYKETOL (registered trademark)-OK (manufactured by BYK Japan K. K.), etc. The corrosion inhibitor may be benzotriazole, etc. The adhesive accelerator may be 2-hydroxmethyl cellulose, etc. The surfactant may be F-472SF (product name) (manufactured by DIC Corporation), etc.

The transparent conductive ink according to the present embodiment may be produced by subjecting the above-mentioned components to stirring, mixing, heating, cooling, dissolving, dispersing, etc., and any appropriately selected combinations of these, using any known methods.

A preferable viscosity of the transparent conductive ink according to the present embodiment may be different depending of a printing method. In case of gravure printing, a viscosity of the transparent conductive ink at 25° C. is preferably 50 to 10000 mPa·s, and more preferably 300 to 5000 mPa·s. In case of screen printing, a viscosity at 25° C. is preferably 100 to $2\times10^5$ mPa·s, and more preferably $1\times10^3$ to $5\times10^4$ mPa·s. The viscosity refers to a value measured by using a cone-plate type rotational viscometer (cone-plate type). In Examples and Comparative Examples below, HBDV-II+Pro manufactured by Brookfield Engineering (plate type, CP-40 (for low viscosity of 26 to 87,200 mPa·s) or CP-52 (for high viscosity of 800 to 2,620,000 mPa·s)) was used.

Using the transparent conductive ink prepared as above, pattern printing in a desired shape, for a transparent electrode, is performed by gravure printing, screen printing, inkjet printing, flexo printing, etc.

There is not specific limitation for the hardness of the substrate for pattern printing. The substrate may be rigid or flexible. The substrate may be colored, but preferably has high transparency for visible light. The material for the substrate may be, for example, glass, polyimide, polycarbonate, polyether sulfone, acrylic resin, polyester (polyethylene terephthalate, polyethylene naphthalate, etc.), polyolefin, polyvinyl chloride. These materials may preferably have a high light transmittance and a low haze value. Further, a circuit of TFT elements, etc., or a functional material such as a color filter, etc., may be formed on the substrate. Further, a large number of substrates may be stacked.

The amount of the transparent conductive ink to be coated on the substrate may be determined taking into account the required thickness of a transparent electrode depending on the intended use. The thickness of the transparent electrode may be adjusted by adjusting the coating amount of the transparent conductive ink and conditions for the coating method.

The printed (coated) transparent conductive ink may be subjected to heating and drying in accordance with needs. The heating temperature may be different depending on the liquid components constituting the dispersion medium, but when the drying temperature is too high, the formed pattern may not be maintained. Therefore, the drying temperature is 120° C. at the highest, and more preferably 100° C. or lower. In particular, the initial drying temperature is important. Initiating the drying at about 40 to 80° C., and raising the temperature step by step so as not exceeding 120° C., is particularly preferable.

A desired surface resistance, total light transmittance, and a haze value of the transparent conductive electrode may be obtained by adjusting the film thickness, i.e., by appropriately selecting a composition, a coating amount, and a coating method of a transparent conductive ink to be used.

In general, the thicker the film thickness, the lower the surface resistance and the total light transmittance. Also, the higher the concentration of the metal nanowire or metal nanotube in the transparent conductive ink, the lower the surface resistance and the total light transmittance and the higher the haze value.

The transparent conductive ink according to the present embodiment may have a lower surface resistance to some extent if the ink is subjected to drying, but in order to efficiently decrease the surface resistance, irradiating a pulsed light is preferable.

In the present specification, the "pulsed light" is a light having a short photo irradiation period (irradiation time). When a plurality of times of photo irradiation are repeated, as shown in FIG. 1, there is a period in which photo irradiation is not performed (irradiation interval (off)) between a first photo irradiation period (on) and a second photo irradiation period (on). In FIG. 1, the pulsed light is illustrated to have a constant light intensity, but the light intensity may vary within one photo irradiation period (on). The pulsed light is irradiated from a light source provided with a flash lamp such as a xenon flash lamp. Using such a light source, pulsed light is irradiated to metal nanowires or metal nanotubes deposited on the substrate. When irradiation is repeated for n-times, one cycle (on+off) in FIG. 1 is repeated for n-times. At the time of repeated irradiation, it is preferable to cool the substrate side when the next pulsed light irradiation is performed in order to prevent the substrate from thermal degradation.

For the pulsed light, electromagnetic waves having a wavelength in the range from 1 pm to 1 m may be used, preferably, electromagnetic waves having a wavelength in the range from 10 nm to 1000 µm may be used (from far ultraviolet to far infrared), and more preferably, electromagnetic waves having a wavelength in the range from 100 nm to 2000 nm may be used. Examples of such electromagnetic wave may be gamma rays, X-rays, ultraviolet rays, visible rays, infrared rays, microwaves, radiowaves on the longer wavelength side of the microwaves, and the like. Considering transformation into thermal energy, too short wavelength is not preferable because the resin substrate, etc. on which the pattern printing is performed, may be largely damaged. Also, too long wavelength is not preferable because efficient absorption and exothermic heating cannot be performed. Accordingly, the wavelength range is preferably the range from the ultraviolet to infrared among the above-mentioned wavelengths, and more preferably, in the range from 100 to 2000 nm.

One irradiation period (on) of the pulsed light is preferably from 20 microseconds to 50 milliseconds, although the period may vary depending on the light intensity. If the period is less than 20 microseconds, sintering of the metal nanowires or the metal nanotubes does not progress, resulting in providing a lower effect of increasing the performance of a transparent electrode. If the period is longer than 50 milliseconds, there may be bad influences on the substrate due to photodegradation and thermal degradation, and further, metal nanowires or metal nanotubes may be easily blown away. More preferably, the irradiation period is from 40 microseconds to 10 milliseconds. Due to the reasons mentioned above, pulsed light instead of continuous light is used in the present embodiment. A single shot of the pulsed light is effective, but the irradiation may be repeated as mentioned above. When the irradiation is repeated, in view of the productivity, the irradiation interval (off) is preferably in the range from 20 microseconds to 5 seconds, and more preferably in the range from 2 milliseconds to 2 seconds. If the irradiation interval is shorter than 20 microseconds, the pulsed light becomes similar to a continuous light and another irradiation is performed after one irradiation without leaving enough time for cooling. Thus, the substrate is heated to a very high temperature and is deteriorated. The irradiation interval longer than 5 seconds is not preferable because the processing time becomes long.

Upon producing a transparent electrode according to the present embodiment, a pattern having a predetermined shape is printed on an appropriate substrate using a transparent conductive ink according to the present embodiment, and the printed pattern may be subjected to heating and drying in accordance with needs. Thereafter, pulsed light having a pulse width (on) in the range of 20 microseconds to 50 milliseconds, and more preferably, in the range of 40 microseconds to 10 milliseconds is irradiated to the pattern using a pulsed xenon irradiation lamp, etc., to thereby join the intersections of the metal nanowires or metal nanotubes. Here, joining means that the material (metal) of the nanowires or nanotubes absorbs the irradiated pulsed light at the intersections of the metal nanowires or nanotubes, internal exothermic heat generation occurs more efficiently at the intersecting portions, and thus, the intersecting portions are welded. By this joining, the contact area between nanowires or nanotubes at the intersecting portion increases, leading to the decrease of surface resistance. Accordingly, intersections of the metal nanowires or metal nanotubes are joined by the pulsed light irradiation, and thereby, a conductive layer having metal nanowires or metal nanotubes in a network form shape can be formed. Therefore, the conductivity of the transparent electrode can be increased, and the surface resistance value becomes 0.1 to 500Ω/□. With respect to the network formed by the metal nanowires or metal nanotubes, a closely-spaced network is not preferable, because if the space is not enough, the light transmittance may be decreased.

The transparent electrode obtained as above comprises a single conductive layer in which metal nanowires and/or metal nanotubes are substantially uniformly located in the binder resin, and the metal nanowires and/or the metal nanotubes intersect with each other. Preferably, the surface resistance value is 0.1 to 500Ω/☐, the total light transmittance is in the range of 60 to 92%, and the haze value is in the range of 0.5 to 80%.

Because the surface roughness of the obtained transparent electrode is influential on the performance of an organic EL element, etc., the surface roughness is expected to show high smoothness. Specifically, the arithmetic average roughness Ra of the transparent electrode is preferably Ra≤5 nm, more preferably Ra≤4 nm, and still more preferably Ra≤1 nm. Further, the root mean square roughness Rq thereof is preferably in the range of 1 nm to 20 nm, and more preferably 5 nm or less.

The surface roughness Ra and the root mean square roughness Rq were measured by tapping mode AFM (Atomic Force Microscope). The device used therefor was NanoScopeIIIa Dimension 3000 (manufactured by Digital Instruments), and as for a cantilever (probe), NCH (monolithic silicon probe, manufactured by NanoWorld) was used. A film sample cut into a 1-cm-square was adhered on a stage with a tape. The measurement was performed under the condition satisfying a scanning size of 10 µm square, scanning/number of lines of 512×512, and a scanning speed of 1.00 s/line. The measured data was subjected to smoothing correction using software accompanied with the device (Version 5.30r3. sr3), and thereby, Ra and Rq were calculated.

When a transparent electrode pattern is printed using a transparent conductive ink containing metal nanowires and/or metal nanotubes, and a binder resin, the binder resin functions as an absorbing component to decrease the surface roughness of the transparent electrode pattern. However, since a flat film is formed by the binder resin covering the metal nanowires and/or metal nanotubes, the transparent electrode pattern has a very high surface resistance, and an insulating film is coated. When the transparent electrode pattern under this state is subjected to pulsed light irradiation, intersections of the metal nanowires and/or metal nanotubes are joined while maintaining the surface roughness, and the binder resin on the surface is removed to expose a part of the metal nanowires and/or metal nanotubes and lower the surface resistance. Conditions for photoirradiation may vary depending on the material and the thickness of a substrate to be used, but, for example, when the photoirrdation device is PulseForge 3300 manufactured by NovaCentrix, an exposure amount of 200 to 5000 mJ/cm², and an exposure time in the range of 20 to 200 µs are preferable.

EXAMPLES

Hereinafter, specific examples of the present disclosure will be explained. The examples are described below for the purpose of easy understanding of the present disclosure, and the present disclosure is not limited to these examples.

<Preparation of FeCl₃ Ethylene Glycol Solution (600 µmol/Liter Solution)>

0.9732 g (0.006 mol) of FeCl₃ (Iron (III) chloride, manufactured by Wako Pure Chemical Industries, Ltd.) was weighed by a 100 ml volumetric flask, and ethylene glycol was poured thereto until reaching approximately 90% relative to the marked line of the flask. After complete dissolution, the solution was diluted by adding ethylene glycol to the marked line. 1 ml of the prepared solution was measured using a volumetric pipette, and transferred to a 100 ml volumetric flask. Then, the flask was filled with ethylene glycol to the marked line to dilute the solution.

<Production of Silver Nanowire>

25 g of ethylene glycol (ethylene glycol, manufactured by Wako Pure Chemical Industries, Ltd.) was measured and transferred into a reactor flask (capacity: 150 ml, outer diameter: 60 mm), and also, 25 g of the ethylene glycol was measured and transferred into a beaker (capacity: 100 ml). 0.2 g (1.8 mmol) of polyvinylpyrrolidone K-90 (manufactured by Wako Pure Chemical Industries, Ltd.) was weighed and gently poured into the reactor flask while stirring. 0.25 g (1.5 mmol) of AgNO₃ (silver nitrate manufactured by Wako Pure Chemical Industries, Ltd.) was weighed and gently poured into the beaker while stirring. After complete dissolution, the solution in the beaker was transferred to the reactor flask, and 3.413 g (0.0018 mmol) of the FeCl₃ ethylene glycol solution (600 µmol/liter solution) prepared as above was added thereto, and the resulting solution was stirred for 5 minutes with a magnetic stirrer. Thereafter, the reactor flask was placed in an organic synthesizer (ChemiStation PPV-CTRL1, manufactured by EYELA Tokyo Rikakikai Co., Ltd.) at a constant temperature of 150° C., and thermally reacted for 1.5 hours. During the thermal reaction, the solution was not stirred.

Before the start of the thermal reaction, the reaction solution was colorless and transparent, but after about 5 minutes from the start of the reaction, the solution became yellowish, and thereafter, the yellow color gradually became richer. After about 30 minutes passed, the solution started to be cloudy and to became grayish. After about one hour, the entirety of the solution became silky gray.

<After-Treatment>

When 1.5 hours passed, heating of the reactor flask was stopped, and the reaction solution was cooled until the temperature thereof became approximately room temperature. Acetone with a capacity of approximately 4 times of the reaction solution, was added to the reactor container. The resulting solution was stirred, and thereafter, placed still, so that the wires were precipitated on the bottom of the reactor flask.

The precipitate was subjected to suction filtration using a tetrafluoroethylene resin PTFE membrane filter having a pore diameter of 3.0 µm and a filter diameter of 47 mm, while attention was paid to prevent the filter from being dried during the operation, and thereby, the wire precipitate was collected. Thereafter, polyvinylpyrrolidone was washed with ethanol. After the filtrate became transparent, the filter was removed and immersed in ethanol to obtain the collected wires by washing. Thereafter, using a vibrator, an ethanol dispersion liquid in which wires were uniformly dispersed, was obtained. The concentration of the silver nanowire was determined by sampling a part of the uniform dispersion liquid and subjecting the sampled liquid to ICP atomic emission spectrochemical (ICP-AES (ICP atomic emission spectrochemical analyzer vista-pro, manufactured by Hitachi High-Tech Science Corporation)) analysis. As a result, the concentration was 0.2% by mass.

FIG. 2(a) and FIG. 2(b) show SEM images of the obtained silver nanowires. The SEM used therefor is FE-SEM S-5200, manufactured by Hitachi High-Technologies Corporation.

As can be understood from FIG. 2(a) and FIG. 2(b), a silver nanowire has a linear shape, the linear wire having a diameter of approximately 70 nm, and a length of 10 to 20 µm. Approximately 95% or more of the total had grown into a linear shape, and the rest has a particle shape.

The length and the diameter of the silver nanowire were measured by SEM and TEM. The TEM used therefor is TEM; JEOL, JEM-2100 transmission electron microscope, manufactured by JEOL, Ltd.

<Preparation of Transparent Conductive Ink>

Example 1

A commercially available silver nanowire dispersion liquid, SLV-NW-35 (isopropanol dispersion liquid, silver nanowire having a diameter of 35 nm and a length of approximately 15 μm (catalog value), manufactured by Blue Nano, Inc.), was used as a raw material for preparing transparent conductive ink. A solution which had been previously prepared by dissolving 0.75 g of polyvinylpyrrolidone (manufactured by Nippon Shokubai Co., Ltd.) to 4.8 g of dipropylene glycol monomethyl ether (purchased as an reagent from Kanto Kagaku Co., Inc.) at a room temperature, was added to 25 mL of the silver nanowire dispersion liquid, and mixed. Thereafter, isopropanol was distilled away, and solvent displacement was performed. Then, 19.2 g of Tersorb MTPH (isobornyl cyclohexanol, manufactured by Nippon Terpene Chemicals, Inc.) was added. The resulting solution was stirred by using Planetary Centrifugal Vacuum Mixer, AWATORI RENTAROU ARE-310, manufactured by Thinky Corporation. Accordingly, a transparent conductive ink having a silver nanowire concentration of 1% by mass, and a polyvinylpyrrolidone concentration of 3% by mass, was obtained.

Examples 2 to 6, and 8

Except that the concentrations of the dipropylene glycol monomethyl ether solution of polyvinylpyrrolidone added to the 25 mL of SLV-NW-35, and the amounts of Tersorb MTPH were changed, operations same as Example 1 were performed, and transparent conductive inks were respectively prepared.

Example 7

An ethanol dispersion liquid of the silver nanowire obtained by the synthesis mentioned above was used as a raw material. Except that the dispersion solvent was ethanol and the concentration was 0.2% by mass, operations same as Example 1 were performed, and a transparent conductive inks was prepared.

Comparative Example 1

An ink containing no binder resin was also prepared, by the same operations.

With respect to each ink, a viscosity at 25° C. was measured using DV-II+Pro manufactured by Brookfield Engineering. The rotor number used therefor was 52.

Using each of these transparent conductive inks, a uniform coating film (metal nanowire layer) was printed over the entirety of a 2.5-cm-square substrate made of Lumirror 125U98 (manufactured by Toray Industries, Inc.), by a screen printer MT-320TVZ (manufactured by Microtek Inc.). Thereafter, a drying process was performed under the conditions mentioned in Table 1, and a single pulsed light at 600V, for 50 μseconds (exposure amount 953 mJ/cm$^2$) was irradiated by PulseForge 3300 manufactured by NovaCentrix.

With respect to each transparent electrode, surface resistance values after the drying process (before the photoirradiation) and after the photoirradiation were measured, by a four-point probe surface resistivity/volume resistivity measurement device, LORESTA-GP MCP-T610, manufactured by Mitsubishi Chemical Corporation. Further, total light transmittance of each transparent electrode was measured by a turbidity meter, NDH2000, manufactured by Nippon Denshoku Industries, Co., Ltd.

Table 1 shows ink viscosity, silver nanowire concentration (calculated value) of an electrode, film thickness, surface resistance after the photoirradiation, total light transmittance, and surface roughness.

TABLE 1

| Example | Ag nanowire material | Ag nanowire conc. (% mass) | Binder type | Binder conc. (% mass) | Solvent | Viscosity mPa · s (25° C.) | Printing Method | Drying conditions |
|---|---|---|---|---|---|---|---|---|
| 1 | bluenano SLV-NW-35 | 1 | polyvinyl pyrrolidone | 3 | dipropylene glycol monomethyl ether/Tersorb MTPH = ¼ | 4300 | screen | 120° C.-1 hr |
| 2 | bluenano SLV-NW-35 | 0.25 | polyvinyl pyrrolidone | 3 | dipropylene glycol monomethyl ether/Tersorb MTPH = ¼ | 4200 | screen | 120° C.-1 hr |
| 3 | bluenano SLV-NW-35 | 0.25 | PMMA | 3 | butyl acetate (IPA remains) | Not measured | bar coater | 100° C.-1 hr |
| 4 | bluenano SLV-NW-35 | 1 | polyvinyl pyrrolidone | 2 | dipropylene glycol monomethyl ether/Tersorb MTPH = ¼ | 1200 | screen | 120° C.-1 hr |
| 5 | bluenano SLV-NW-35 | 0.25 | polyvinyl pyrrolidone | 5 | dipropylene glycol monomethyl ether/Tersorb MTPH = ¼ | 8700 | screen | 100° C.-1 hr |
| 6 | bluenano SLV-NW-35 | 0.25 | polyvinyl acetamide | 3 | dipropylene glycol monomethyl ether/Tersorb MTPH = ¼ | 3800 | screen | 120° C.-1 hr |
| 7 | Synthesized product | 0.25 | polyvinyl pyrrolidone | 3 | dipropylene glycol monomethyl ether/Tersorb MTPH = ¼ | 4100 | screen | 120° C.-1 hr |

TABLE 1-continued

| 8 | bluenano SLV-NW-35 | 1 | polyvinyl pyrrolidone | 0.125 | dipropylene glycol monomethyl ether/Tersorb MTPH = ¼ | 2100 | screen | 120° C.-1 hr |
| Comparative Example 1 | bluenano SLV-NW-35 | 0.25 | none | 0 | dipropylene glycol monomethyl ether/Tersorb MTPH = ¼ | 500 | bar coater | 120° C.-1 hr |

| | Electrode properties | | Photo-irradiation conditions | | Surface resistance ($\Omega/\square$) | | | Surface roughness | |
|---|---|---|---|---|---|---|---|---|---|
| Example | Ag content (calc. value) | Film thickness (nm) | Volt. V | Time μsec | Before irradiation | After irradiation | Transmittance (%) | Ra nm | Rq nm |
| 1 | 25.0% | 300 | 600 | 50 | O.L. | 30 | 88 | 3.1 | 4.3 |
| 2 | 7.7% | 300 | 600 | 50 | O.L. | 120 | 90 | 1.5 | 3.2 |
| 3 | 7.7% | 300 | 600 | 50 | O.L. | 110 | 90 | 1.6 | 3.3 |
| 4 | 33.3% | 200 | 600 | 50 | O.L. | 28 | 89 | 2.9 | 4.5 |
| 5 | 4.8% | 500 | 600 | 50 | O.L. | 110 | 90 | 1.6 | 3.3 |
| 6 | 7.7% | 300 | 600 | 50 | O.L. | 105 | 87 | 1.4 | 3.1 |
| 7 | 7.7% | 300 | 600 | 50 | O.L. | 130 | 86 | 1.6 | 3.3 |
| 8 | 88.9% | — | 600 | 50 | O.L. | 100 | 90 | 4.8 | 9.8 |
| Comparative Example 1 | 100.0% | — | 600 | 50 | 4000 | 100 | 88 | 5.7 | 12.7 |

The term "OL" shown in the section of surface resistance before photoirradiation, refers to a value exceeding the upper limit.

In Example 3, butyl acetate was used for the solvent. Because the viscosity was too low, the coating film was formed by a bar coater, instead of performing screen printing. Also, in Comparative Example 1, the coating film was formed by a bar coater.

The film thickness of the obtained transparent conductive film was measured as below. A sample on which each transparent conductive film was formed, was cut into a predetermined size by a knife, and thereafter, the cut-out sample was reinforced by being held between thin plates of SUS (stainless steel) under the conditions that the sample protruded from the ends of the SUS plates by approximately 1 mm. The reinforced sample was placed on a sample holder of the SEM, and the cross section was observed by the SEM. In Example 8 and Comparative Example 1, the film thicknesses were not measured, because the amount of the resin component located near the silver wire was too small to form a sample for the film thickness measurement by the above method.

It has been found that the transparent conductive films (transparent electrode) of Examples obtained by using a transparent conductive ink for forming a transparent electrode according to the present disclosure which contains a certain amount of binder resin, show smaller surface roughness, compared to the film of Comparative Example using an ink containing no binder resin.

The invention claimed is:

1. A method for producing transparent electrode comprising:
   a step of printing an electrode pattern having a desired shape on a substrate with a transparent conductive ink having a viscosity of 300 mPa·s to $2 \times 10^5$ mPa·s at 25° C., the transparent conductive ink being prepared by dispersing metal nanowires and/or metal nanotubes in a solution formed by dissolving a thermoset or thermoplastic binder resin having no fluidity within the range of 5 to 40° C. to a solvent, and the content of the binder resin being 100 to 2500 parts by mass relative to 100 parts by mass of the metal nanowires and/or metal nanotubes; and
   a step of irradiating pulsed light to the printed electrode pattern,
   wherein the transparent electrode has a surface arithmetic average roughness Ra satisfying Ra≤5 nm.

2. The method for producing transparent electrode according to claim 1, wherein the solvent contains an organic solvent.

3. The transparent conductive ink according to claim 2, wherein the organic solvent has a boiling point of 50° C. or more and 200° C. or less.

4. The transparent conductive ink according to claim 2, wherein the organic solvent has a boiling point of 120° C. or more and 360° C. or less.

5. The method for producing transparent electrode according to claim 1, wherein the step of printing is performed by gravure printing and the transparent conductive ink having a viscosity of 300 to 5000 mPa·s at 25° C.

6. The transparent conductive ink according to claim 5, wherein the organic solvent has a boiling point of 50° C. or more and 200° C. or less.

7. The method for producing transparent electrode according to claim 1, wherein the step of printing is performed by screen printing and the transparent conductive ink having a viscosity of $1 \times 10^3$ to $5 \times 10^4$ mPa·s at 25° C.

8. The transparent conductive ink according to claim 7, wherein the organic solvent has a boiling point of 120° C. or more and 360° C. or less.

9. A transparent conductive ink for forming a transparent electrode comprising metal nanowires and/or metal nanotubes, a solvent, and a thermoset or thermoplastic binder resin having no fluidity within the range of 5 to 40° C. and to be dissolved in the solvent, the content of the binder resin being 100 to 2500 parts by mass relative to 100 parts by mass of the metal nanowires and/or metal nanotubes,
   wherein the transparent conductive ink has a viscosity of 300 mPa·s to $2 \times 10^5$ mPa·s at 25° C.

10. The transparent conductive ink according to claim 9, wherein the solvent contains an organic solvent.

11. The transparent conductive ink according to claim 10, wherein the organic solvent has a boiling point of 50° C. or more and 200° C. or less.

12. The transparent conductive ink according to claim 10, wherein the organic solvent has a boiling point of 120° C. or more and 360° C. or less.

13. The transparent conductive ink according to claim 9, wherein the content of the binder resin is 300 to 2500 parts by mass relative to 100 parts by mass of the metal nanowires and/or metal nanotubes.

* * * * *